(12) United States Patent
Kang et al.

(10) Patent No.: US 11,765,889 B2
(45) Date of Patent: Sep. 19, 2023

(54) METHOD TO SCALE DRAM WITH SELF ALIGNED BIT LINE PROCESS

(71) Applicant: Applied Materials, Inc., Santa Clara, CA (US)

(72) Inventors: Sung-Kwan Kang, Santa Clara, CA (US); Fredrick Fishburn, Aptos, CA (US); Abdul Wahab Mohammed, Santa Clara, CA (US); Gill Yong Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 31 days.

(21) Appl. No.: 17/727,907

(22) Filed: Apr. 25, 2022

(65) Prior Publication Data
US 2022/0352176 A1 Nov. 3, 2022

Related U.S. Application Data

(60) Provisional application No. 63/182,164, filed on Apr. 30, 2021.

(51) Int. Cl.
*H10B 12/00* (2023.01)
(52) U.S. Cl.
CPC ......... *H10B 12/485* (2023.02); *H10B 12/482* (2023.02)
(58) Field of Classification Search
CPC ............................ H10B 12/482; H10B 12/485

USPC ......................................................... 438/262
See application file for complete search history.

(56) References Cited

U.S. PATENT DOCUMENTS

| 5,670,404 | A | 9/1997 | Dai |
| 6,429,473 | B1 | 8/2002 | Cronin et al. |
| 10,672,456 | B2 | 6/2020 | Fishburn et al. |
| 2010/0006906 | A1 | 1/2010 | Rhee et al. |
| 2011/0053369 | A1 | 3/2011 | Jang et al. |
| 2020/0066728 | A1* | 2/2020 | Lu .......................... H10B 12/34 |
| 2020/0295008 | A1 | 9/2020 | Tang et al. |
| 2020/0357804 | A1 | 11/2020 | Lee et al. |
| 2021/0066304 | A1 | 3/2021 | Kang et al. |

OTHER PUBLICATIONS

Kusters, K., et al., "A Self Aligned Contact Process With Improved Surface Planarization", Journal de Physique Colloques, 1988, 49 (C4), pp. C4-503-C4-506. 10.1051/jphyscol:19884104. jpa-00227837.
PCT International Search Report and Written Opinion in PCT/US2022/026879 dated Aug. 18, 2022, 8 pages.

* cited by examiner

*Primary Examiner* — Hoai V Pham
(74) *Attorney, Agent, or Firm* — Servilla Whitney LLC

(57) ABSTRACT

Memory devices and methods of forming memory devices are described. Methods of forming electronic devices are described where a spacer is formed around each of the bit line contact pillars, the spacer in contact with the spacer of an adjacent bit line contact pillar. A doped layer is then epitaxially grown on the memory stack and bit line is formed on the memory stack. The bit line is self-aligned with the active region.

20 Claims, 6 Drawing Sheets

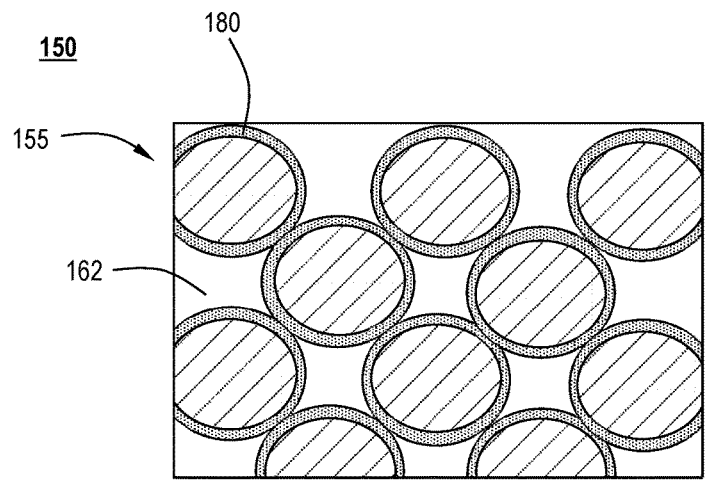
FIG. 5
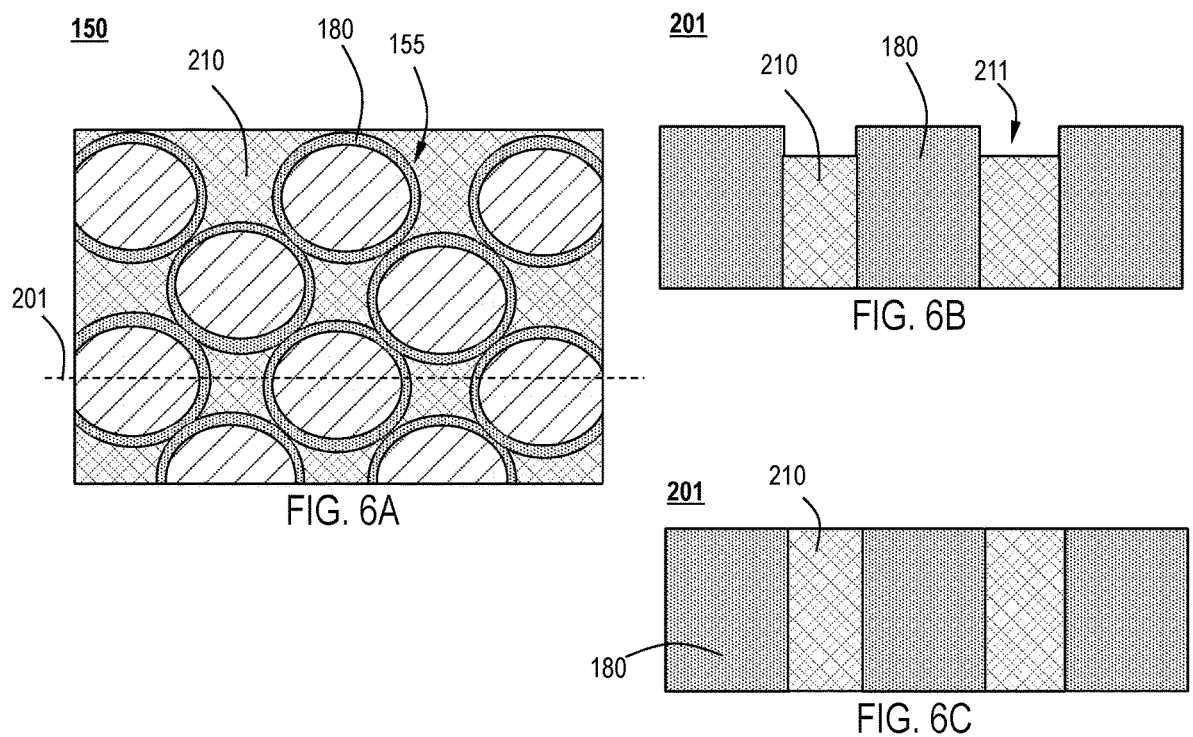
FIG. 6A
FIG. 6B
FIG. 6C

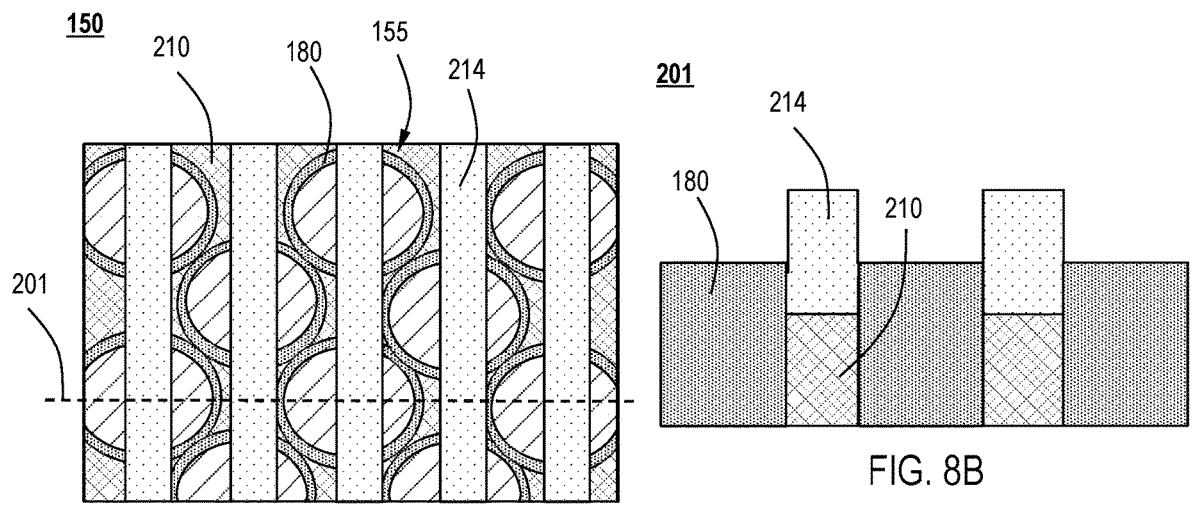
FIG. 8A
FIG. 8B
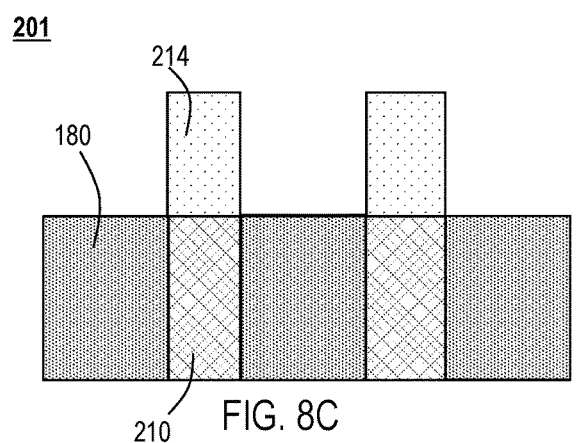
FIG. 8C

METHOD TO SCALE DRAM WITH SELF ALIGNED BIT LINE PROCESS

CROSS-REFERENCE TO RELATED APPLICATIONS

This application claims priority to U.S. Provisional Application No. 63/182,164, filed Apr. 30, 2021, the entire disclosure of which is hereby incorporated by reference herein.

TECHNICAL FIELD

Embodiments of the present disclosure pertain to the field of electronic devices and electronic device manufacturing. More particularly, embodiments of the disclosure provide electronic devices including a self-aligned bit line contact and methods of forming same.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

The integrated circuit density on semiconductor substrates has dramatically increased, and the minimum feature sizes, such as the field effect transistor (FET) channel lengths and the word line widths on dynamic random-access memory (DRAM) have dramatically decreased. As the critical dimensions are reduced, etching to form the bit line is more challenging and leads to misalignment and polysilicon string issues, such as skirt defect. Additionally, contact resistance increases, leading to lower drive current.

Therefore, there is a need in the art for methods of forming bit line contacts that are self-aligned and do not have skirt defects.

SUMMARY

One or more embodiments of the disclosure are directed to a method of forming a semiconductor device. In one or more embodiments, the method comprises: forming a plurality of bit line contact pillars extending through a memory stack, the memory stack comprising a dielectric material and an active region; forming a spacer around each of the bit line contact pillars, the spacer in contact with the spacer of an adjacent bit line contact pillar; epitaxially growing a doped layer on the active region; and forming a bit line on the memory stack, the bit line aligned with the active region.

Additional embodiments of the disclosure are directed to a method of forming a semiconductor device. In one or more embodiments, the method comprises: forming a spacer around a plurality of bit line contact pillars, the spacer in contact with the spacer of an adjacent bit line contact pillar, the plurality of bit line contact pillars extending through a memory stack comprising a dielectric material and an active region; selectively epitaxially growing a doped layer on the memory stack, the doped layer dopant with a dopant having a concentration in a range of from $1 \times 10^{20}$ to $5 \times 10^{21}$; and depositing one or more of a mask layer, a bit line metal layer, and a barrier metal layer on the memory stack and etching to form a bit line on the memory stack, the bit line aligned with the active region and substantially free of skirt defects.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 5 illustrates a top view of a DRAM device according to one or more embodiments;

FIG. 6A illustrates a top view of a DRAM device according to one or more embodiments;

FIG. 6B illustrates a view along line 201 of the DRAM device of FIG. 6A according to one or more embodiments;

FIG. 6C illustrates a view along line 201 of the DRAM device of FIG. 6A according to one or more alternative embodiments;

FIG. 8A illustrates a top view of a DRAM device according to one or more embodiments;

FIG. 8B illustrates a view along line 201 of the DRAM device of FIG. 8A according to one or more embodiments;

FIG. 8C illustrates a view along line 201 of the DRAM device of FIG. 8A according to one or more alternative embodiments.

DETAILED DESCRIPTION

Figure 1:
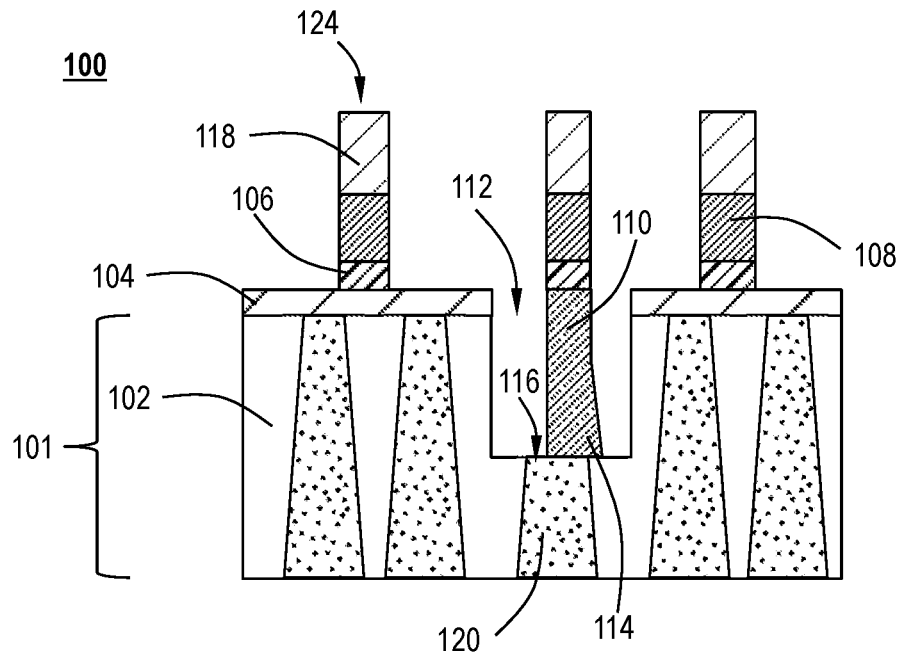
FIG. 1 illustrates a cross-section view of a DRAM device according to the prior art.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used herein, the term "dynamic random-access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor.

DRAM devices having self-aligned bit line contacts without skirt defects and methods for forming self-aligned bit line contacts are provided. One or more embodiments of the disclosure advantageously address the issues of misalignment and poly-silicon string skirt defects in spite of the need for shrinking critical dimensions. In some embodiments, the resistivity of the bit line contact is reduced by providing self-alignment and no poly-silicon string skirt defects.

Some embodiments of the disclosure advantageously provide methods that employ the formation of a spacer around a bit line contact pillar, followed by epitaxially growing a doped layer to form a self-aligned bit line. One or more embodiments of the disclosure generally provide structures which include one or more low-resistivity features formed from a thin film refractory metal (e.g., tungsten) as may be implemented in bit line structures and/or gate stacks. Some embodiments include methods for forming self-aligned bit lines. By way of example, a bit line structure formed in accordance with embodiments of the present disclosure may be a memory type semiconductor device, such as a DRAM type integrated circuit.

Figure 2:
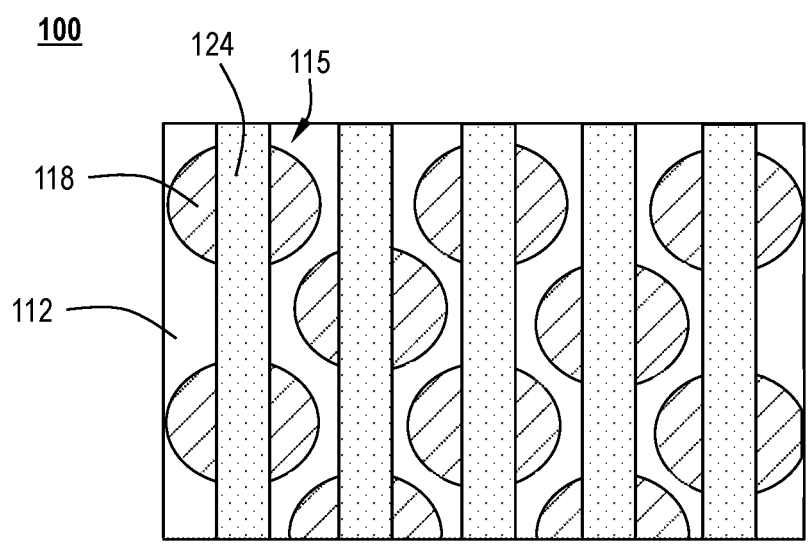
FIG. 2 illustrates a top view of a DRAM device according to the prior art.

FIG. 1 illustrates a cross-sectional view of a memory device 100 according to the prior art. FIG. 2 illustrates a top view of a memory device 200 according to the prior art. The skilled artisan will recognize that the film stacks illustrated in the drawings are an exemplary portion (the bit line portion) of a memory device. With reference to FIGS. 1 and 2, DRAM devices 100 of the prior art include a memory stack 101 which comprises a dielectric material 102 and an active region 120. A plurality of bit line contact pillars 115 extend through the memory stack 101. The bit line contact pillars 115 include a silicon nitride layer 118 and a poly-silicon layer 110. During processing to form the bit line 124, a skirt defect 114 forms, and the bit line 124 is not aligned with the active region 120. There is a misalignment 116 between the base of the bit line 124 and the active region 120. As illustrated in FIG. 2, there is an open region 112 between adjacent bit line contact pillars 115. Without intending to be bound by theory, it is thought that the skirt defect 114 leads to increased resistance and lower drive current.

Accordingly, in one or more embodiments, a device 150 is provided that is substantially free of any skirt defect. As used herein, the term "substantially free" means that there is less than about 5%, including less than about 4%, less than about 3%, less than about 2%, less than about 1%, and less than about 0.5% of a skirt defect on the base of the bit line contact. In some embodiments, there is no skirt defect.

In one or more embodiments, the bit line 155 is self-aligned with the active region 170, such that there is substantially no misalignment between the base of the bit line 155 and the active region.

Figure 3:
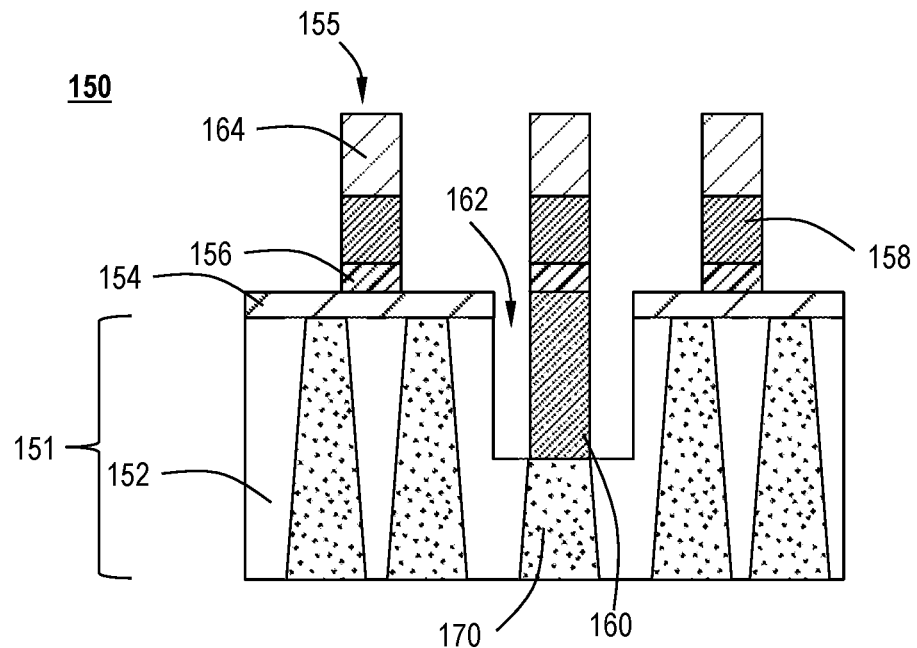
FIG. 3 illustrates a cross-section view of a DRAM device according to one or more embodiments.

With reference to FIG. 3, a DRAM device 150 of one or more embodiments includes a memory stack 151 which comprises a dielectric material 152 and an active region 170. The dielectric material 152 may comprise any suitable dielectric material known to the skilled artisan. As used herein, the term "dielectric materials" refers to a material that is an electrical insulator that can be polarized in an electric field. In some embodiments, the dielectric material 152 comprises a low-k dielectric. In one or more embodiments, the dielectric material 152 comprises one or more of oxides, carbon doped oxides, silicon dioxide ($SiO_2$), porous silicon dioxide ($SiO_2$), silicon dioxide ($SiO_2$), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH). In one or more embodiments, the dielectric material includes, without limitation, furnace, CVD, PVD, ALD and spin-on-coat (SoC) deposited films. In one or more embodiments, the dielectric material may be exposed to in-situ or ex-situ pretreatment and post-treatment process to dope, infuse, implant, heat, freeze, polish, etch, reduce, oxidize, hydroxylate, anneal, UV cure, e-beam cure and/or bake the surface or bulk of the dielectric. In addition to film processing directly on the surface of the dielectric material itself, in one or more embodiments, any of the film processing steps disclosed may also be performed on an underlayer formed on the dielectric material as disclosed in more detail below, and the term "dielectric surface" is intended to include such underlayer as the context indicates. Thus, for example, where a film/layer or partial film/layer has been deposited onto a dielectric surface, the exposed surface of the newly deposited film/layer becomes the dielectric surface. In one or more specific embodiments, the low-k dielectric may comprise one or more silicon oxide ($SiO_x$), silicon nitride (SiN), and silicon carbonitride (SiCN).

As used herein, the term "active region" refers to a layer of material in which a channel, a bit line, a word line, or a capacitor can be made. In one or more embodiments, the active region 170 comprises one or more of silicon or doped silicon. For example, in one or more embodiments, the channel material is selected from one or more of Si, molybdenum sulfide ($MoS_2$), or IGZO (In—Ga—Zn Oxide) and replaces the cavities after the active region material has been structured.

In one or more embodiments, a plurality of bit lines 155 extend through the memory stack 151. As used herein, the term "bit line" refers to a layer(s) of material that is an electrical conductor. In one or more embodiments, the bit line includes, without limitation, growth silicon. In one or more embodiments, the bit line may be exposed to in situ or ex situ pre-treatment and post-treatment process(es) to fuse, freeze, heat, microwave, polish, etch, reduce, oxidize, hydroxylate, anneal, UV cure, e-beam cure and/or bake the bulk or surface of the bit line. In one or more embodiments, forming the bit line 155 comprises depositing one or more of a mask layer 164, a bit line metal layer 158, and a barrier metal layer 156 on the memory stack 151 and etching to form the bit line 155.

In one or more embodiments, the mask layer may comprise any suitable material known to the skilled artisan. In some embodiments, the mask layer comprises one or more of silicon nitride (SiN), silicon oxide (SiO$_x$), and carbon (C).

In one or more embodiments, the bit line metal layer 158 may comprise any suitable metal known to the skilled artisan. In some embodiments, the bit line metal layer 158 may comprises one or more of copper (Cu), cobalt (Co), tungsten (W), titanium (Ti), molybdenum (Mo), nickel (Ni), ruthenium (Ru), silver (Ag), gold (Au), iridium (Ir), or platinum (Pt). In specific embodiments, the bit line metal layer comprises one or more of tungsten (W), molybdenum (Mo), and ruthenium (Ru).

The thickness of the bit line metal layer 158 can be varied. In some embodiments, the bit line metal layer 158 has a thickness in a range of about 100 Å to about 300 Å, or in the range of about 120 Å to about 250 Å, or in the range of about 140 Å to about 200 Å, or in the range of about 160 Å to about 180 Å.

The bit line metal layer 158 can be deposited by any suitable technique known to the skilled artisan. In some embodiments, the bit line metal layer 158 is deposited by one or more of chemical vapor deposition, atomic layer deposition or physical vapor deposition.

In one or more embodiments, the barrier metal layer 156 may comprise any suitable metal known to the skilled artisan. In some embodiments, the barrier metal layer 156 (also referred to as a conductive layer) is on the polysilicon layer 160. The barrier metal layer 156 can be any suitable conductive material. In some embodiments, the barrier metal layer 156 comprises one or more of titanium (Ti), tantalum (Ta), titanium silicide (TiSi), or tantalum silicide (TaSi). In some embodiments, the barrier metal layer 156 comprises titanium. In some embodiments, the barrier metal layer 156 consists essentially of titanium. In some embodiments, the barrier metal layer 156 comprises or consists essentially of tantalum. In some embodiments, the barrier metal layer 156 comprises or consists essentially of titanium silicide. In some embodiments, the barrier metal layer 156 comprises or consists essentially of tantalum silicide. As used in this manner, the term "consists essentially of" means that the subject film comprises greater than or equal to about 95%, 98%, 99% or 99.9% of the stated element or composition, on an atomic basis. For example, a barrier metal layer 156 consisting essentially of titanium has a film that is greater than or equal to about 95%, 98%, 99% or 99.5% titanium as deposited. In one or more embodiments, the barrier metal layer 156 comprises one or more of titanium (Ti), tantalum (Ta), and tungsten (W).

A mask layer 164 is formed on the bit line metal layer 158. The mask layer 164 can be deposited by any suitable technique known to the skilled artisan. In some embodiments, the mask layer 164 is deposited by one or more of chemical vapor deposition or atomic layer deposition.

In some embodiments, the mask layer 164 comprises one or more of silicon nitride, silicon carbonitride or silicon carbide. In some embodiments, the mask layer 164 consists essentially of silicon nitride. In some embodiments, the mask layer 164 consists essentially of silicon carbonitride. In some embodiments, the mask layer 164 consists essentially of silicon carbide.

The thickness of the mask layer 164 can be varied. In some embodiments, the mask layer 164 has a thickness in the range of about 30 Å to about 50 Å.

The deposition temperature of the mask layer 164 can be controlled to, for example, preserve the thermal budget of the device being formed. In some embodiments, the mask layer 164 is formed at a temperature less than or equal to about 500° C., or about 450° C., or about 400° C., or about 350° C., or about 300° C. In some embodiments, the mask layer 164 is formed at a temperature in the range of about 350° C. to about 550° C., or in the range of about 400° C. to about 500° C.

With reference to FIG. 3, the bit lines 155 include a silicon nitride layer 158 and a poly-silicon layer 160. During processing to form the bit line 155, no skirt defect forms, and the bit line 155 is self-aligned with the active region 170. There is no misalignment between the base of the bit line 155 and the active region 170.

Figure 4:
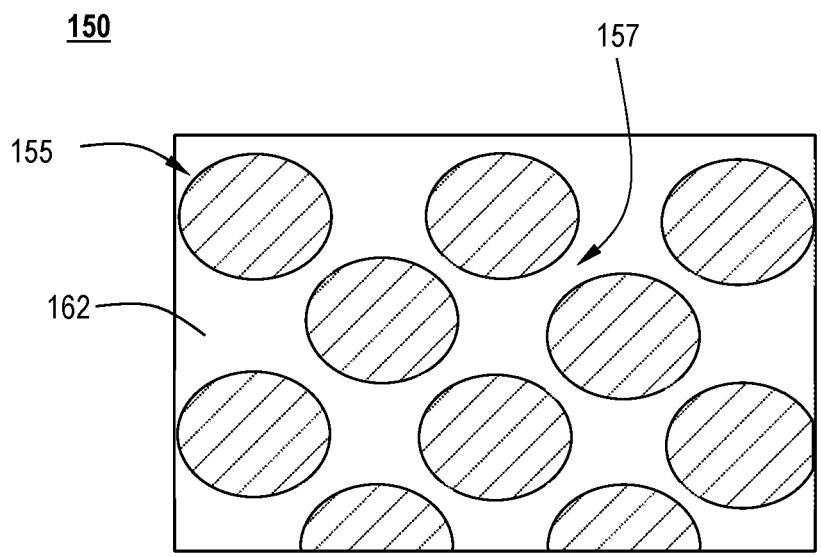
FIG. 4 illustrates a top view of a DRAM device according to one or more embodiments.
Figure 9:
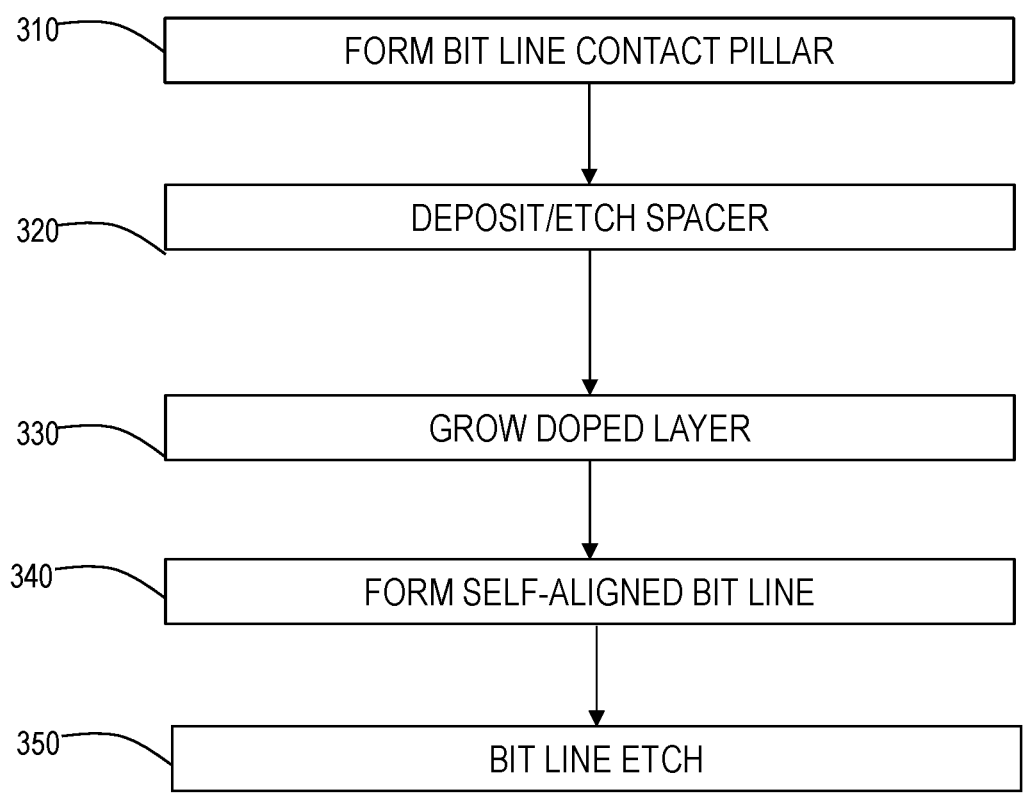
FIG. 9 illustrates a process flow diagram for a method for forming a device according to one or more embodiments.

Referring to FIGS. 4 and 9, formation of the memory device 150 comprises, at operation 310, forming a bit line contact pillar 155 on a memory stack. The bit line contact pillar 155 comprises one or more of a poly-silicon (poly-Si) layer 160 and a silicon nitride layer 158. A gap 157 is present between adjacent bit line contact pillar 155 revealing open space 162.

With reference to FIG. 5 and FIG. 9, at operation 312, a spacer 180 is formed around each of the bit line contact pillars 155. In one or more embodiments, the spacer 180 is in contact with the spacer 180 of an adjacent bit line contact pillar 155. Thus, in one or more embodiments, the spacer 180 eliminates the gap 157 between adjacent bit line contact pillars 155.

The spacer 180 may comprise any suitable material known to the skilled artisan. In one or more embodiments, the spacer 180 comprises one or more of silicon nitride (SiN) and silicon carbonitride (SiCN). In specific embodiments, the spacer 180 comprises silicon nitride (SiN).

With reference to FIGS. 6A, 6B, 6C, and FIG. 9, at operation 330, a doped layer 210 is epitaxially grown on the memory stack. The doped layer 210 is grown around the bit line contact pillars 155. In some embodiments, as illustrated in FIG. 6B, the doped layer 210 is partially grown such that it is not coplanar with a top surface of the bit line contact pillar 155 and the spacer 180. Referring to FIG. 6B, in some embodiments, the doped layer 210 is below the top surface of the bit line contact pillar 155 leaving an opening 211 on the top surface of the bite line contact pillar 155. In other embodiments, as illustrated in FIG. 6B, the doped layer 210 is fully grown such that it is coplanar with a top surface of the bit line contact pillar 155 and the spacer 180.

In one or more embodiments, the doped layer 210 may comprise any suitable material known to the skilled artisan. In one or more embodiments, the doped layer comprises selective silicon doped with a dopant. The dopant may comprise any suitable dopant known to the skilled artisan. In one or more embodiments, the dopant is selected from the group consisting of phosphorus (P), arsenic (As), and combinations thereof.

In some embodiments, the doped layer is doped with a dopant in a concentration in a range of from $1\times10^{20}$ to $5\times10^{21}$.

Figure 7A:
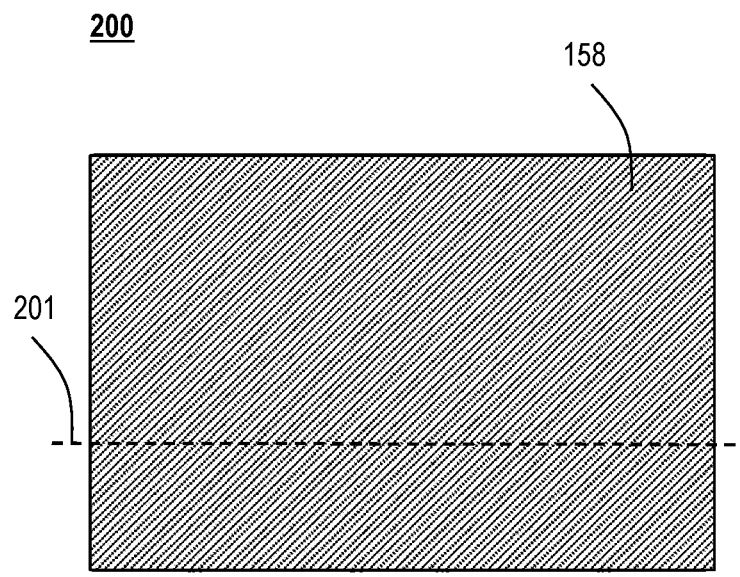
FIG. 7A illustrates a top view of a DRAM device according to one or more embodiments.
Figure 7B:
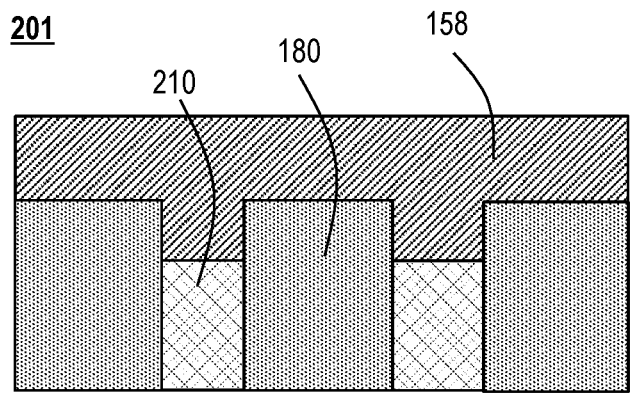
FIG. 7B illustrates a view along line 201 of the DRAM device of FIG. 7A according to one or more embodiments.
Figure 7C:
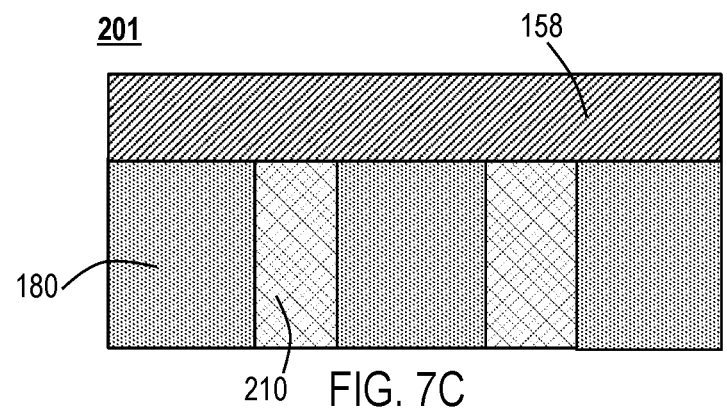
FIG. 7C illustrates a view along line 201 of the DRAM device of FIG. 7A according to one or more alternative embodiments.

Referring to FIGS. 7A, 7B, 7C, and FIG. 9, at operation 340, a bit line is formed by depositing one or more of a mask layer, a bit line metal layer 158, and a barrier metal layer 156 on the memory stack. As illustrated in FIG. 7B, in embodiments where the doped layer is deposited below the top surface of the bit line contact pillar 155, the bit line metal layer 158 may be deposited so that the bit line metal layer 158 fills the opening 211. Referring to FIG. 7C, in embodiments where the doped layer is coplanar with the top surface of the bit line contact pillar 155, the bit line metal layer 158 is deposited on the top surface of the doped layer 210 and the bit line contact pillar 155.

Referring to FIGS. 8A, 8B, 8C, and FIG. 9, at operation 350, the memory stack is etched to form the bit line 214. As illustrated in FIG. 8B, in embodiments where the doped layer is deposited below the top surface of the bit line contact pillar 155, the bit line 214 is formed so that the bit line fills the opening 211. Referring to FIG. 8C, in embodiments where the doped layer is coplanar with the top surface of the bit line contact pillar 155, the bit line 214 is formed on the top surface of the doped layer 210 and the bottom surface of the bit line 214 is substantially coplanar with the top surface of the spacer 180.

Additional embodiments of the disclosure are directed to methods of forming a memory device. The skilled artisan will recognize that the methods described can form a portion of a memory device (e.g., a bit line) which can be part of a complete memory device. FIG. 9 illustrates a process flow for an exemplary method 300 for forming a memory device.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a semiconductor device, the method comprising:
   forming a plurality of bit line contact pillars extending through a memory stack, the memory stack comprising a dielectric material and an active region;
   forming a spacer around each of the bit line contact pillars, the spacer in contact with the spacer of an adjacent bit line contact pillar;
   epitaxially growing a doped layer on the active region; and
   forming a bit line on the memory stack, the bit line aligned with the active region.

2. The method of claim 1, wherein the dielectric material comprises a low-k dielectric selected from the group consisting of silicon oxide ($SiO_x$), silicon nitride (SiN), silicon carbonitride (SiCN), and combinations thereof.

3. The method of claim 1, wherein the plurality of bit line contact pillars comprise one or more of a silicon oxide and a silicon nitride layer.

4. The method of claim 1, wherein forming the bit line comprises depositing one or more of a mask layer, a bit line metal layer, and a barrier metal layer on the memory stack and etching to form the bit line.

5. The method of claim 4, wherein the mask layer comprises one or more of silicon nitride (SiN), silicon oxide ($SiO_x$), and carbon (C).

6. The method of claim 4, wherein the bit line metal layer comprises one or more of tungsten (W), molybdenum (Mo), and ruthenium (Ru).

7. The method of claim 4, wherein the barrier metal layer comprises one or more of titanium (Ti), tantalum (Ta), and tungsten (W).

8. The method of claim 1, wherein the spacer comprises one or more of silicon nitride (SiN) and silicon carbonitride (SiCN).

9. The method of claim 1, wherein the doped layer comprises selective silicon doped with a dopant selected from the group consisting of phosphorus (P), arsenic (As), and combinations thereof.

10. The method of claim 9, wherein the dopant has a concentration in a range of from $1\times10^{20}$ to $5\times10^{21}$.

11. The method of claim 1, wherein the doped layer is substantially coplanar with a top surface of the plurality of bit line contact pillars.

12. The method of claim 1, wherein the doped layer is below a top surface of the plurality of bit line contact pillars.

13. The method of claim 1, wherein the bit line is substantially free of skirt defects.

14. A method of forming a semiconductor device, the method comprising:
   forming a spacer around a plurality of bit line contact pillars, the spacer in contact with the spacer of an adjacent bit line contact pillar, the plurality of bit line contact pillars extending through a memory stack comprising a dielectric material and an active region;
   selectively epitaxially growing a doped layer on the memory stack, the doped layer doped with a dopant having a concentration in a range of from $1\times10^{20}$ to $5\times10^{21}$; and
   depositing one or more of a mask layer, a bit line metal layer, and a barrier metal layer on the memory stack and etching to form a bit line on the memory stack, the bit line aligned with the active region and substantially free of skirt defects.

15. The method of claim 14, wherein the doped layer is substantially coplanar with a top surface of the plurality of bit line contact pillars.

16. The method of claim 14, wherein the doped layer is below a top surface of the plurality of bit line contact pillars.

17. The method of claim 14, wherein the dielectric material comprises a low-k dielectric selected from the group consisting of silicon oxide ($SiO_x$), silicon nitride (SiN), silicon carbonitride (SiCN), and combinations thereof.

18. The method of claim 14, wherein the bit line metal layer comprises one or more of tungsten (W), molybdenum (Mo), and ruthenium (Ru).

19. The method of claim 14, wherein the barrier metal layer comprises one or more of titanium (Ti), tantalum (Ta), and tungsten (W).

20. The method of claim 14, wherein the doped layer comprises selective silicon and the dopant is selected from the group consisting of phosphorus (P), arsenic (As), and combinations thereof.

* * * * *